United States Patent
Rothman et al.

(10) Patent No.: US 7,750,466 B2
(45) Date of Patent: Jul. 6, 2010

(54) MICROELECTRONIC ASSEMBLY HAVING SECOND LEVEL INTERCONNECTS INCLUDING SOLDER JOINTS REINFORCED WITH CRACK ARRESTER ELEMENTS AND METHOD OF FORMING SAME

(75) Inventors: Timothy P. Rothman, El Dorado, CA (US); Leo J. Craft, Shingle Springs, CA (US); Dong W. Kim, El Dorado Hills, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/852,173

(22) Filed: Sep. 7, 2007

(65) Prior Publication Data

US 2009/0065943 A1    Mar. 12, 2009

(51) Int. Cl.
*H01L 23/485* (2006.01)
(52) U.S. Cl. .................. 257/737; 257/686; 257/738; 257/E23.021
(58) Field of Classification Search .......... 257/686, 257/737, 738, E23.021
See application file for complete search history.

(56) References Cited

U.S. PATENT DOCUMENTS

| | | | | |
|---|---|---|---|---|
| 6,927,471 B2* | 8/2005 | Salmon | ............... | 257/499 |
| 7,271,497 B2* | 9/2007 | Joshi et al. | ............... | 257/780 |
| 7,521,284 B2* | 4/2009 | Miranda et al. | ............. | 438/106 |
| 2003/0234277 A1* | 12/2003 | Dias et al. | ............... | 228/180.22 |

OTHER PUBLICATIONS

Satoru Zama et al.; Flip Chip Interconnect Systems Using Copper Wire Stud Bump and Lead Free Solder; IEEE Transactions on Electronics Packaging Manufacturing, vol. 24, No. 4, Oct. 2001 261.
Delta, Danish Electronics et al.; The Nordic Electronics Packaging Guideline, Chapter B; http://extra.ivf.se/ngl/B-Flip-Chip/ChapterB.htm.
Flipchips Dot Com; Images from photo page of FlipChip Dot Com; http://www.flipchips.com/photos.html.
Satoru Zama, Daniel F. Baldwin, Toshiya Hikami and Hideaki Murata, "Flip Chip Interconnection Systems Using Copper Wire Stud Bump and Lead Free Solder", IEEE Transactions on Electronics Package Manufacturing, vol. 24, No. 4, Oct. 2001, p. 261.

* cited by examiner

*Primary Examiner*—Victor A Mandala
(74) *Attorney, Agent, or Firm*—Blakely, Sokoloff, Taylor & Zafman LLP

(57) ABSTRACT

A microelectronic assembly and a method of forming the assembly. The microelectronic assembly includes a package having a package substrate having a die side and a carrier side, and substrate lands on the carrier side thereof; a microelectronic die mounted on the package substrate at the die side thereof; and an array of first level interconnects electrically coupling the die to the package substrate. The assembly further includes a carrier having a substrate side, the package being mounted on the carrier at the substrate side thereof; and an array of second level interconnects electrically coupling the package to the carrier, each of the second level interconnects including a solder joint connecting the substrate lands to the carrier lands, and a crack arrester element at least partially encompassed within the solder joint.

7 Claims, 3 Drawing Sheets

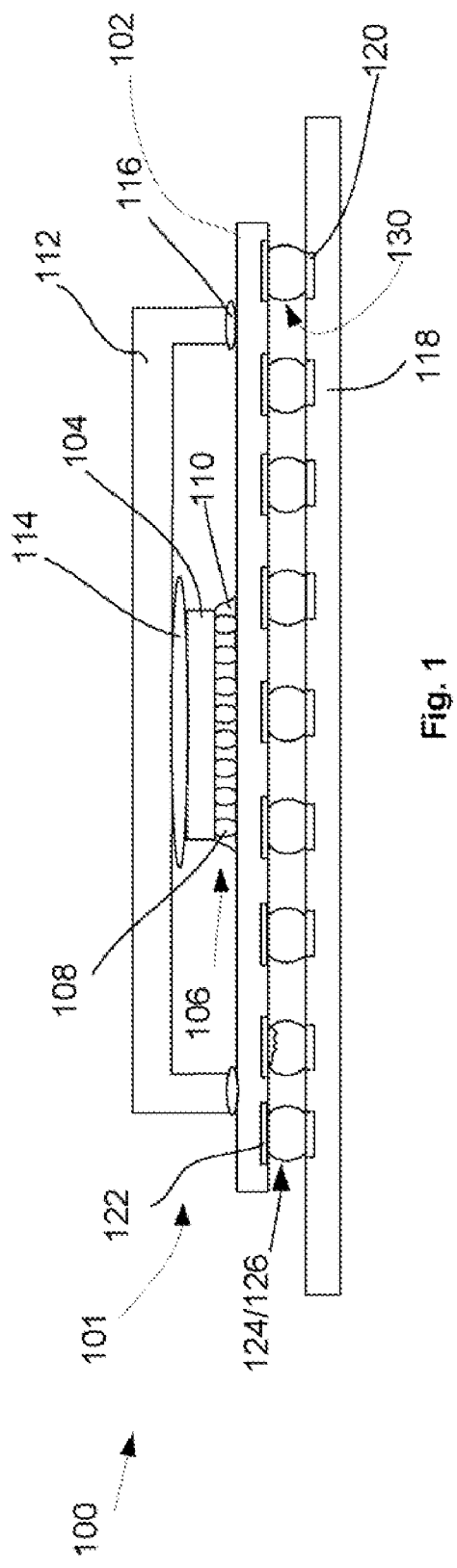
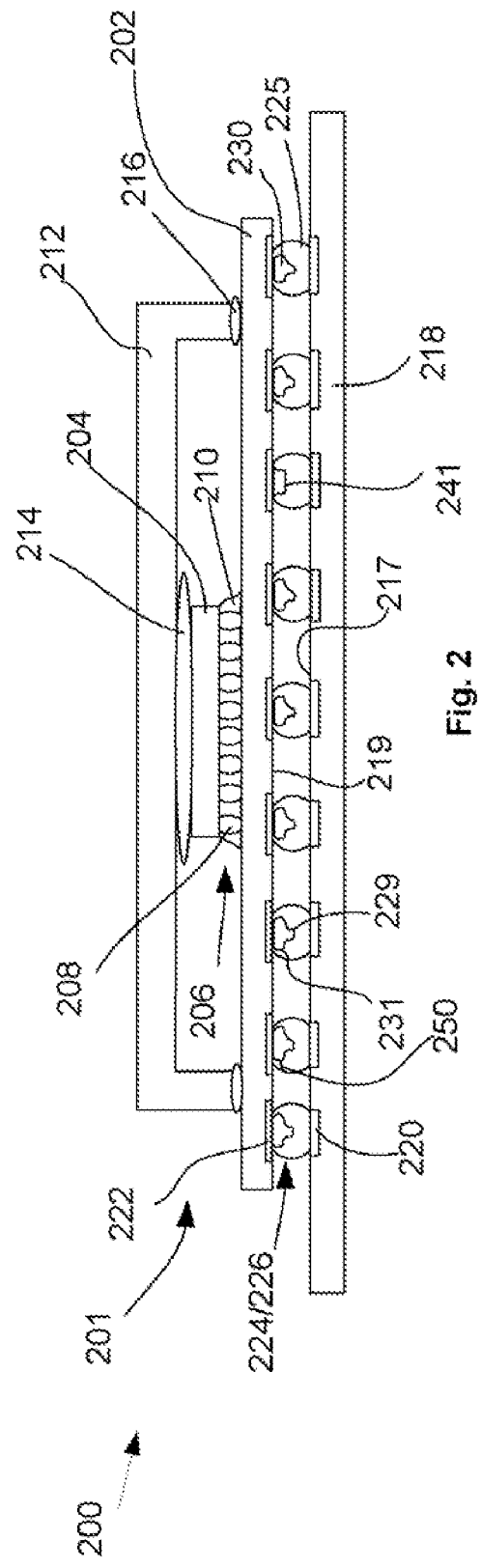
Fig. 1
Prior Art
Fig. 2

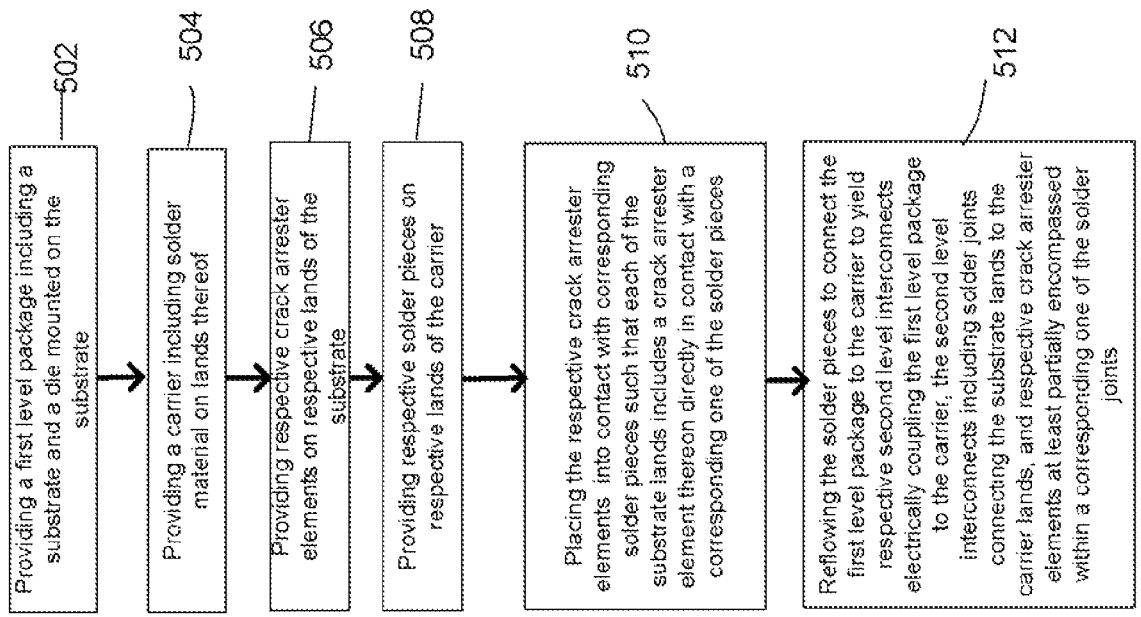
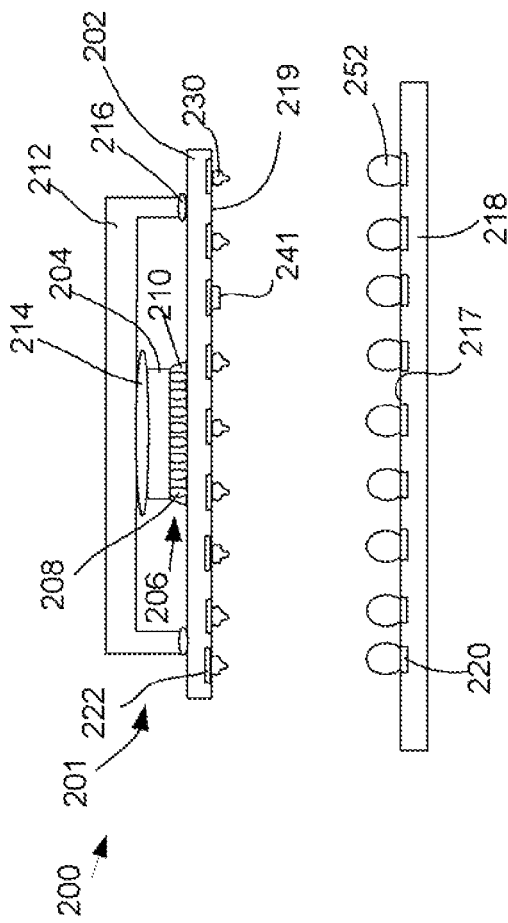
Fig. 4
Fig. 5

MICROELECTRONIC ASSEMBLY HAVING SECOND LEVEL INTERCONNECTS INCLUDING SOLDER JOINTS REINFORCED WITH CRACK ARRESTER ELEMENTS AND METHOD OF FORMING SAME

FIELD

Embodiments of the present invention relate generally to the field of microelectronic fabrication, and, in particular to a method of providing second level interconnects between a package substrate including a die mounted thereon and a carrier such as the substrate of a motherboard or circuit board.

BACKGROUND

Conventionally, second level interconnects according to the prior art are provided by way of solder balls. Second level interconnects include electrical interconnects provided between a package substrate having a die mounted thereon (hereinafter, a "package"), and a carrier such as the substrate of a circuit board. By "carrier," what is thus meant herein is the next level substrate onto which the package is adapted to be mounted.

Typically, the prior art uses solder joints as the second level interconnects. To provide the solder joints, the prior art uses either solder balls or solder paste, which are then subjected to a reflow process, optionally involving thermal compression bonding. A solder resist layer may be disposed on the carrier, and the solder resist openings may be provided with flux prior to the solder ball placement process. The flux may be applied through a mask, or by way of a dip or spray process. Where solder paste is used, the paste may be applied by way of printing through a mask in a conventional manner. The package and the carrier thereafter undergo a reflow process at temperatures up to about 260 degrees Celsius. After solder joint formation, the first level interconnects may be supplied with an underfill material, such as with an epoxy material.

Disadvantageously, using solder joints for second level interconnects can among other things lead to cracked solder joints. As devices become smaller and thinner, thinner packages and smaller interconnect pitches are required. To accommodate such thinning, one option has been to reduce the package standoff with respect to the carrier using smaller solder balls or, as noted above, an LGA process where the solder paste for surface mount is the primary interconnect feature. However, smaller solder balls are hard to place, and present open/cold joint issues and or merged ball issues, especially as the size reduction of the package makes warpage of the package substrate a factor in the reliability of the second level interconnects. In addition, LGA joints also coplanarity issues, brought about mainly as a result of a warpage of the package substrate. Moreover, solder joints in general tend to crack as a result of stresses created by a number of factors including: differential thermal expansions between the substrate and the carrier; mechanical loading of the die; and flexure, drop or shock on the package.

In FIG. 1, a conventional microelectronic Assembly 100 is shown including a package 101 comprising a package substrate 102 supporting a die 104 thereon. The die 104 is shown as having been electrically and mechanically joined/bonded to the package substrate 102 by way of an array 106 of solder joints 108, and further by way of cured underfill material 110 as shown. An integrated heat spreader (IHS) lid 112 is further mounted onto package substrate 102 and thermally coupled to the die 104 by way of a thermal interface material (TIM) 114. Lid 112 is supported on the package substrate 102 by way of sealant 116. The package 101 is in turn supported on and electrically and mechanically bonded to a carrier 118, such as the substrate of a circuit board. Carrier 118 includes carrier lands 120 thereon adapted to allow an electrical connection of the carrier 118 to additional circuitry. In turn, package substrate 102 includes substrate lands 122 thereon adapted to allow an electrical connection of the package 201 to external circuitry. The lands 120 and/or 122 may include ENIG pads, for example. An array 124 of solder joints 126 is shown between the carrier lands 120 and the substrate lands 122, the solder joints 126 making up the second level interconnects. As seen in FIG. 1, a cracking of one or more of the solder joints 126 may occur as a result of the CTE mismatch between carrier 118 and the package 101.

The prior art fails to provide a reliable, cost-effective package substrate structure and method that address the disadvantages of second level interconnects including solder joints.

BRIEF DESCRIPTION OF THE DRAWINGS

FIG. 1 is a schematic side cross-sectional view of a prior art microelectronic Assembly including solder joint second level interconnects;

FIG. 2 is a schematic side cross-sectional view of a microelectronic package according to an embodiment;

FIG. 4 is a schematic side cross-sectional view of the package as it is being mounted onto the carrier to yield the package of FIG. 2 according to an embodiment;

FIG. 5 is a flow diagram showing stages in the fabrication of a microelectronic package according to an embodiment.

Figure 6:
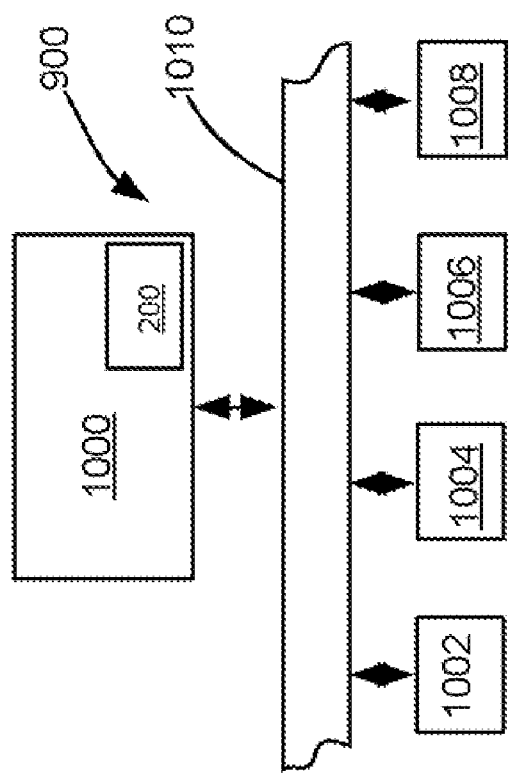
FIG. 6 is a schematic view of an embodiment of a system incorporating a microelectronic package as shown in either of FIG. 2 or 3.

For simplicity and clarity of illustration, elements in the drawings have not necessarily been drawn to scale. For example, the dimensions of some of the elements may be exaggerated relative to other elements for clarity. Where considered appropriate, reference numerals have been repeated among the drawings to indicate corresponding or analogous elements.

DETAILED DESCRIPTION

In the following detailed description, a microelectronic package including stud bumps as part of the second level interconnects, and a method of forming the same are disclosed. Reference is made to the accompanying drawings within which are shown, by way of illustration, specific embodiments by which the present invention may be practiced. It is to be understood that other embodiments may exist and that other structural changes may be made without departing from the scope and spirit of the present invention.

The terms on, above, below, and adjacent as used herein refer to the position of one element relative to other elements. As such, a first element disposed on, above, or below a second element may be directly in contact with the second element or it may include one or more intervening elements. In addition, a first element disposed next to or adjacent a second element may be directly in contact with the second element or it may include one or more intervening elements. In addition, in the instant description, figures and/or elements may be referred to in the alternative. In such a case, for example where the description refers to Figs. X/Y showing an element A/B, what is meant is that Fig. X shows element A and Fig. Y shows element B.

Aspects of this and other embodiments will be discussed herein with respect to FIGS. 2-6 below. The figures, however, should not be taken to be limiting, as it is intended for the purpose of explanation and understanding.

Referring to FIG. 2 microelectronic assembly 200 is shown according to a first embodiment. In each of the embodiments, the assembly 200 may include a package 201 comprising a package substrate 202 supporting a die 204 thereon and having a die side and a carrier side. The die 204 may be mounted, that is, electrically and mechanically coupled to the package substrate 202 on the die side thereof, by way of an array 206 of first level interconnects including, for example, solder joints 208, and further by way of cured underfill material 210. Although a C4 solder connection is shown between die 204 and package substrate 202, it is noted that embodiments are not so limited, and include within their ambit any type of first level interconnection between die and package substrate, such as, for example, first level interconnects including wire-bonds, conductive adhesives, or any other ones of well known die to substrate interconnects as would be within the knowledge of a skilled person. An integrated heat spreader (IHS) lid 212 may further be mounted onto package substrate 202 and thermally coupled to the die 204 by way of a thermal interface material (TIM) 214. Lid 212 is supported on the package substrate 202 by way of sealant 216. Additionally, although a lid IHS is shown in the embodiments of FIG. 2, it is noted that embodiments are not so limited, and include within their scope a package that does not include an IHS, and/or one that includes an IHS not necessary limited to a lid. The package 201 may in turn be mounted on, that is, electrically and mechanically coupled to, a carrier 218, such as the substrate of a circuit board. Carrier 218 may have a substrate side 217, and may include carrier lands 220 on the substrate side thereof adapted to allow an electrical connection of the carrier 218 to additional circuitry. In turn, package substrate 202 may include substrate lands 222 on the carrier side 219 thereof adapted to allow an electrical connection of the package 201 to external circuitry. The lands 220 and/or 222 may include ENIG pads, for example, or any other type of land as would be within the knowledge of a skilled person. Although not shown, it is understood that a variety of components other than the die 204 may be placed on the package substrate or on the carrier as appropriate, including an On-Package-Voltage-Regulation device, or OPVR, an Integrated Semiconductor Voltage Regulator or ISVR, a Dynamic Random Access Memory or DRAM, or various other devices such as capacitors, inductor, resistors, and other packages, as would be within the knowledge of a skilled person.

An array 224 of second level interconnects 226 is shown between the carrier lands 220 and the substrate lands 222. The second level interconnects 226 include a solder joint 225 connecting the substrate lands to the carrier lands, and a crack arrester element, such as stud bump 230 or stitch bond 241, at least partially encompassed within the solder joint 225. By "crack arrester element," what is meant in the context of embodiments is any body that is adapted, when at least partially encompassed within a solder joint, to stop or "arrest" a crack from propagating within the solder joint. In the shown embodiment, the crack arrester elements include stud bumps 230 or stitch bonds 241. Embodiments are not limited to crack arrester elements that include either stud bumps or stitch bonds, but encompass within their scope any body of any shape and any material adapted to arrest a crack in a solder joint. In addition, although FIG. 2 shows a combination of stitch bonds and stud bumps, embodiments are not so limited, and include within their scope the use of only stud bumps, only stitch bonds, a combination of both, or a combination of crack arrester elements of any shape and size and material according to application needs. The stud bumps 230 and stitch bonds 241 in the embodiment of FIG. 2 are shown as being fully encompassed within a corresponding solder joint 225. However, embodiments include within their scope the provision of second level interconnects where the crack arrester elements are only partially encompassed within a corresponding solder joint. In the shown embodiment, each stud bump 230 and stitch bond 241 is directly connected to a corresponding one of the substrate lands 222. Although the shown embodiment of FIG. 2 includes second level interconnects each of which includes a single stud bump or stitch bond, embodiments are not so limited, and include within their scope a second level interconnect that includes a plurality of stud bumps or stitch bonds, or other crack arrester elements, such as, for example, a plurality of stacked stud bumps (not shown). Providing stacks of crack arrester elements would be beneficial for example where the package substrate may be warped, in which case stacks of varying heights could compensate for such warpage and ensure a level mounting of the package onto the carrier. According to an embodiment, the crack arrester elements are made substantially of Au, or substantially of Cu, that is, preferably, the crack arrester elements include at least 90% by weight Au or at least 90% by weight. Preferably, the crack arrester elements are made of 99% by weight gold or of 99% by weight of copper. Most preferably, the crack arrester elements are made substantially of Cu. According to an embodiment, the solder joints may include one of SnAgCu, SnPb and InPb solder. As seen in FIG. 2, each of the stud bumps 230 or stitch bonds 241 may function as a crack arrester to stop a crack, such as crack 250, which would have propagated through an associated solder joint had the stud bump not been present.

Figure 3A:
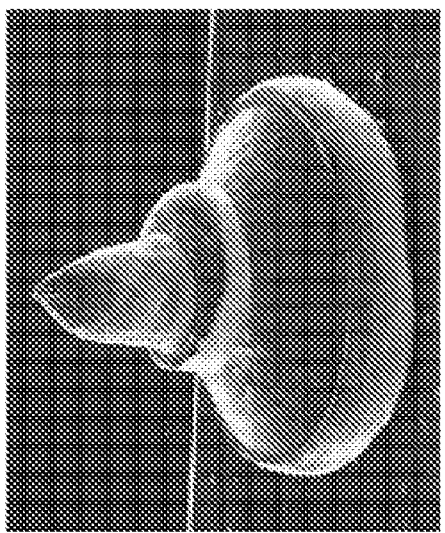
FIG. 3a is an electron micrograph of an embodiment of a stud bumps as may be used in embodiments.

By "stud bump," what is meant in the context of the instant description is a bump or ball such as one that may be obtained by using a conventional wire bonding machine to achieve ball bonding, whether coined or not coined, as is well known in the art. An exemplary view of a typical uncoined stud bump is shown in FIG. 3a, which may be obtained, as is well known, using a conventional wire bonding device to perform ball bonding. In ball bonding, the tip of the wire extending through a capillary of a wire bonding head is melted to form a sphere. The wire bonding tool then presses the sphere against the surface on which the sphere is resting, such as, in the case of embodiments, against either the substrate lands or the carrier lands. Pressing may be effected for example using mechanical force, heat, ultrasonic energy or a combination of the same to cause plastic deformation of the sphere and further atomic interdiffusion between the material of the sphere and the underlying metallization, such as, in the case of embodiments, between the gold material of the sphere and the metallization of the associated substrate land or carrier land, in this way forming a ball bond with the land. At this time, a wire clamp of the wire bonding tool may be closed to clamp off the wire, leaving a stud in the shape of the stud shown in FIG. 3a. The stud bump may be further flattened, or "coined" after placement of the same by way of mechanical pressure in order to provide a flatter top surface and a more uniform bump height, in this way pressing any wire tail into the ball. In FIG. 2, the stud bump of each of the interconnects 226 which directly faces a corresponding one of the carrier lands 218 is shown as including a wire tail portion 229 and a flattened ball portion 231, which may be formed as noted above. Although not shown, embodiments include within their scope the provision of stud bumps that are coined as described above.

Figure 3B:
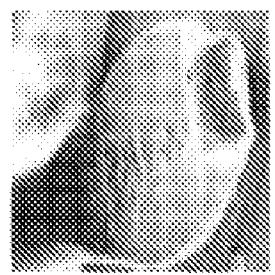
FIG. 3b is an electron micrograph of an embodiment of a stitch bond as may be used in embodiments.

By "stitch bond," what is meant in the context of the instant description is a wedge or fishtail shaped bond such as one that may be obtained by using a conventional wire bonding machine to achieve stitch or wedge bonding, as is well known in the art. Pressure and ultrasonic forces may applied to the wire to form the stitch bond, as shown in FIG. 3b. The wire-bonding machine or wirebonder breaks the wire by clamping the wire and raising the capillary.

According to embodiments, a method of providing a microelectronic package may include, as shown in FIG. 5, and with particular reference to FIG. 4 (noting that FIG. 4 shows the package of FIG. 2 prior to its mounting onto the carrier of FIG. 2), at block 502 providing a package, such as package 201 of FIG. 2/4; and at block 504, providing a carrier such as carrier 218 of FIG. 2/4. Such method may also include: at blocks 506-512, providing an array of second level interconnects electrically coupling the package to the carrier, such as second level interconnects 226 of FIG. 2. Specifically, at block 506, a method embodiment may include providing respective crack arrester elements on respective substrate lands, such as stud bumps 230 or stitch bonds 241 of FIG. 2/4. Providing the respective stud bumps or stitch bonds could include using a wire bonder, and further could include providing a single layer of stud bumps or stitch, such as in the case of FIG. 2, or stacks of stud bumps. The stud bumps may be coined or uncoined according to application needs. Thereafter, at block 508, a method embodiment may include providing solder pieces, such as solder pieces 252 of FIG. 4, on respective ones of the carrier lands. The solder pieces could include either solder balls, or solder paste, or any other solder containing body, such as, for example, solder paste including any one of SnAgCu, SnPb or InPb. Those solder pastes for example could include 96Sn3.5Ag0.55Cu, 63Sn37Pb, or 60In40Pb. The paste may, for example, be deposited on the carrier lands by stencil printing in a well known manner. Thereafter, at block 510, a method embodiment may include placing the respective crack arrester elements, such as stud bumps 230 or stitch bonds 241 of FIG. 4, into contact with corresponding solder pieces, such as solder pieces 252 of FIG. 4, such that each of the substrate lands includes a crack arrester element thereon directly in contact with a corresponding one of the solder pieces. The crack arrester elements may be advanced onto respective solder pieces on respective ones of the carrier lands. At block 512, a method embodiment may include reflowing the solder pieces to connect the package to the carrier to yield the respective second level interconnects, such as second level interconnects 226 of FIG. 2. Reflowing may include, for example, either a convection reflow process, or a compression bonding process. For a convection reflow process, a reflow temperature profile may be selected according to recommended process conditions of the solder supplier. For example, a peak reflow temperature may be set at about 30 degrees Celsius above the solder liquidus temperature, and held from about 40 second or more above this temperature. For a compression bonding process, either a high temperature bonding process or a B-stage cure process may be used. The high temperature bonding process may be performed at a temperature above the liquidus temperature while a bonding force is being applied, such as, for example, a temperature of about 240 degrees Celsius for about 20 seconds, with a bonding force of about 30 gf/bump. The B-stage process may include a compression bond interconnect followed by reflow. B-stage processing may include forming a compression interconnect at a temperature below the liquidus, and thereafter using convection reflow at a temperature above liquidus according to an optimized temperature profile. For example, the bonding temperature may be set at 150 degrees Celsius for about 60 seconds at a bonding force of about 30 gf/bump, followed by convection reflow as explained above. A method embodiment may further include providing an underfill material between the substrate and the carrier (not shown). Where a convection reflow process is used, the underfill material may be provided after reflow. However, where a compression bonding process is used, the underfill material may be provided before reflow, and cured during reflow.

Advantageously, embodiments provide a reliable, cost-effective package substrate structure and method that address the disadvantages of second level interconnects including solder joints. In particular, embodiments allow the provision of second level interconnects including respective solder joints connecting the substrate lands to the carrier lands, and respective crack arrester elements at least partially encompassed within the respective solder joints. The crack arrester elements may include, for example, stud bumps or stitch bonds, and are effective to stop a crack about to propagate in a solder joint, such as, for example, a crack occurring as a result of CTE mismatches between the carrier and the package and/or substrate, as a result of mechanical loading of the die, and/or as a result of flexure of the package, drop or shock by providing a stop element in the path of the crack. Provision of the crack arrester elements according to an embodiment advantageously allow the use of a wire bonder or any appropriate conventional bonder to create a robust mechanical attachment between the package and the carrier while preventing open circuits resulting as a result of solder cracking. Advantageously embodiments allow the accommodation of reducing package sizes and interconnect pitches without the need for expensive additional tooling. Additionally, the use of stacks of crack arrester elements, such as stacks of stud bumps, in a single second level interconnect advantageously overcomes planarity issues with respect to warped substrate by providing differential stack heights to compensate for warpage as explained above.

Referring to FIG. 6, there is illustrated one of many possible systems 900 in which embodiments of the present invention may be used. In one embodiment, the electronic arrangement 1000 may include a microelectronic assembly, such as package 200 of FIG. 2. Arrangement 1000 may further include a microprocessor. In an alternate embodiment, the electronic arrangement 1000 may include an application specific IC (ASIC). Integrated circuits found in chipsets (e.g., graphics, sound, and control chipsets) may also be packaged in accordance with embodiments of this invention.

For the embodiment depicted by FIG. 6, the system 900 may also include a main memory 1002, a graphics processor 1004, a mass storage device 1006, and/or an input/output module 1008 coupled to each other by way of a bus 1010, as shown. Examples of the memory 1002 include but are not limited to static random access memory (SRAM) and dynamic random access memory (DRAM). Examples of the mass storage device 1006 include but are not limited to a hard disk drive, a compact disk drive (CD), a digital versatile disk drive (DVD), and so forth. Examples of the input/output module 1008 include but are not limited to a keyboard, cursor control arrangements, a display, a network interface, and so forth. Examples of the bus 1010 include but are not limited to a peripheral control interface (PCI) bus, and Industry Standard Architecture (ISA) bus, and so forth. In various embodiments, the system 90 may be a wireless mobile phone, a personal digital assistant, a pocket PC, a tablet PC, a notebook PC, a desktop computer, a set-top box, a media-center PC, a DVD player, and a server.

The various embodiments described above have been presented by way of example and not by way of limitation. Having thus described in detail embodiments of the present invention, it is understood that the invention defined by the appended claims is not to be limited by particular details set forth in the above description, as many variations thereof are possible without departing from the spirit or scope thereof.

What is claimed is:

1. A microelectronic assembly including:
   a package including:
      a package substrate having a die side and a carrier side, and substrate lands on the carrier side thereof;
      a microelectronic die mounted on the package substrate at the die side thereof; and
      an array of first level interconnects electrically coupling the die to the package substrate;
   a carrier having a substrate side, the package being mounted on the carrier at the substrate side thereof; and
   an array of second level interconnects electrically coupling the package to the carrier, each of the second level interconnects including a solder joint connecting the substrate lands to the carrier lands, and a crack arrester element fully encompassed within the solder joint wherein the crack arrester element includes one of a stud bump and a stitch bond.

2. The assembly of claim 1, wherein the crack arrester element of said each of the second level interconnects is directly connected to a corresponding one of the substrate lands.

3. The assembly of claim 1, wherein the crack arrester element of said each of the second level interconnects includes a plurality of crack arrester elements.

4. The assembly of claim 1, wherein the plurality of crack arrester elements includes stacked crack arrester elements.

5. The assembly of claim 1, wherein the crack arrester element of said each of the second level interconnects is made substantially of gold or substantially of copper.

6. The assembly of claim 1, wherein the solder joints include one of SnAgCu, SnPb and InPb.

7. The assembly of claim 1 wherein the crack arrester element is a coined stud bump.

* * * * *